(12) United States Patent
Basol et al.

(10) Patent No.: US 6,932,896 B2
(45) Date of Patent: Aug. 23, 2005

(54) METHOD AND APPARATUS FOR AVOIDING PARTICLE ACCUMULATION IN ELECTRODEPOSITION

(75) Inventors: Bulent M. Basol, Manhattan Beach, CA (US); Cyprian Uzoh, Milpitas, CA (US); Homayoun Talieh, San Jose, CA (US)

(73) Assignee: Nutool, Inc., Milpitas, CA (US)

(*) Notice: Subject to any disclaimer, the term of this patent is extended or adjusted under 35 U.S.C. 154(b) by 183 days.

(21) Appl. No.: 09/982,558

(22) Filed: Oct. 17, 2001

(65) Prior Publication Data
US 2002/0139682 A1 Oct. 3, 2002

Related U.S. Application Data
(60) Provisional application No. 60/280,524, filed on Mar. 30, 2001.

(51) Int. Cl.[7] .................................................. C25D 5/22
(52) U.S. Cl. .................. 205/93; 205/205; 205/206; 205/220; 205/221; 205/222; 205/223; 205/640; 205/660; 205/662; 451/56; 451/72
(58) Field of Search ............................. 205/205, 206, 205/220, 221, 222, 223, 640, 660, 662, 93; 451/56, 72

(56) References Cited

U.S. PATENT DOCUMENTS

| | | |
|---|---|---|
| 4,849,599 A | 7/1989 | Kuromatsu |
| 5,807,165 A | 9/1998 | Uzoh et al. |
| 6,004,880 A | 12/1999 | Liu et al. |
| 6,203,413 B1 * | 3/2001 | Skrovan ................. 451/72 |
| 6,299,741 B1 * | 10/2001 | Sun et al. ............ 204/224 M |
| 6,343,977 B1 * | 2/2002 | Peng et al. ............... 451/56 |

FOREIGN PATENT DOCUMENTS

| | | |
|---|---|---|
| EP | 0 421 350 | 4/1991 |
| EP | 1 103 346 | 5/2001 |
| WO | WO 99/26758 | 6/1999 |
| WO | WO 00/26443 | 5/2000 |

* cited by examiner

*Primary Examiner*—Wesley A. Nicolas
(74) *Attorney, Agent, or Firm*—Pillsbury Winthrop LLP

(57) ABSTRACT

Systems and methods to remove or lessen the size of metal particles that have formed on, and to limit the rate at which metal particles form or grow on, workpiece surface influencing devices used during electrodeposition are presented. According to an exemplary method, the workpiece surface influencing device is occasionally placed in contact with a conditioning substrate coated with an inert material, and the bias applied to the electrodeposition system is reversed. According to another exemplary method, the workpiece surface influencing device is conditioned using mechanical contact members, such as brushes, and conditioning of the workpiece surface influencing device occurs, for example, through physical brushing of the workpiece surface influencing device with the brushes. According to a further exemplary method, the workpiece surface influencing device is rotated in different direction during electrodeposition.

44 Claims, 12 Drawing Sheets

METHOD AND APPARATUS FOR AVOIDING PARTICLE ACCUMULATION IN ELECTRODEPOSITION

This application claims benefit of U.S. Pat. Ser. No. 60/280,524 filed Mar. 30, 2001.

BACKGROUND OF THE INVENTION

1. Field of the Invention

The present invention relates to a method and apparatus for removing particles from surfaces, and avoiding particle accumulation on surfaces during, electrochemical mechanical processing.

2. Description of the Related Art

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of such features, i.e., via openings, trenches, pads or contacts can be carried out by depositing a conductive material over the substrate including such features.

Copper and copper alloys have recently received considerable attention as interconnect materials because of their superior electromigration and low resistivity characteristics. The preferred method of copper deposition is electrodeposition. During fabrication, copper is deposited on the substrate that has been previously coated with a barrier layer and then a seed layer. The barrier layer coats the vias and the trench as well as the surface of the dielectric layer to ensure good adhesion and acts as a barrier material to prevent diffusion of the copper into the semiconductor devices through the dielectric insulation layer. Typically, seed layer forms a conductive material base for copper film growth during the subsequent copper deposition. Typical barrier materials generally include tungsten, tantalum, titanium, their alloys, and their nitrides. The deposition process can be carried out using a variety of processes. After depositing copper into the features on the semiconductor wafer surface, an etching, an electropolishing (also called electroetching), an electrochemical mechanical etching (ECME) or a chemical mechanical polishing (CMP) step may be employed. These processes remove the conductive materials off the field regions of the surface, thereby leaving the conductive materials only within vias, trenches and other features.

In conventional electrodeposition techniques, copper is coated on the wafer surface in a conformal manner. As shown in FIGS. 1–3, when, for example, a dual damascene structure on the wafer surface is coated with copper using conventional plating, it yields a rather conformal film. FIGS. 1–3 show three possible stages in the conventional process. In a first stage shown in FIG. 1, the dual damascene structure 10 with a wide trench 11, a small via 12 covered with a barrier layer 13 and a copper seed layer 14 is shown. As the copper film is electroplated in a second stage shown in FIG. 2, the copper 15 quickly fills the small via 12 but coats the wide trench and the surface in a conformal manner. When the deposition process is continued, the wide trench is also filled with copper in a third stage shown in FIG. 3, but with a resulting large step 'S' and a thick surface copper layer 't'.

Thick copper on the surface presents a problem during the material removal step such as a CMP step, which is expensive and time consuming. Techniques that can yield thin surface copper overburden and small or no 'S' step are very attractive, which is exemplified in FIG. 4.

The importance of overcoming the various deficiencies of the conventional electrodeposition techniques is evidenced by technological developments directed to the deposition of planar copper layers. For example, U.S. Pat. No. 6,176,992, entitled "Method and Apparatus for Electrochemical Mechanical Deposition" and commonly owned by the assignee of the present invention, describes in one aspect an electro chemical mechanical deposition technique (ECMD) that achieves deposition of the conductive material into the cavities on the substrate surface while minimizing deposition on the field regions by polishing the field regions with a pad as the conductive material is deposited, thus yielding planar copper deposits. In another aspect, this application describes an electrochemical mechanical etching (ECME) or electroetching or electropolishing technique that removes conductive material from the surface of a workpiece.

U.S. Pat. No. 6,534,116 for "Plating Method and Apparatus that Creates a Differential Between Additive Disposed on a Top Surface and a Cavity Surface of a Workpiece Using an External Influence," also assigned to the same assignee as the present invention, describes in one aspect another ECMD method and apparatus for plating a conductive material onto the substrate by creating an external influence, such as causing relative movement between a workpiece and a mask, to cause a differential in additives to exist for a period of time between a top surface and a cavity surface of a workpiece. While the differential is maintained, power is applied between an electrode (in this case anode) and the substrate to cause greater relative plating of the cavity surface than the top surface.

These ECMD methods can deposit metals in and over cavity sections on a workpiece in a planar manner. Some methods even have the capability to provide deposits with excess metal in and over the cavities. In such above-mentioned processes, a pad, a mask or a sweeper, hereinafter collectively referred to as a workpiece-surface-influencing device (WSID), can be used during at least a portion of the electrodeposition process when there may be physical contact between the workpiece surface and the WSID. The physical contact, polishing, or the external influence affects the growth of the metal by effectively reducing the growth rate on the top surface with respect to the features. During the process step that involves the WSID being in close proximity to, and typically in contact with, the metal surface, small particles of the metal may attach onto the WSID material. These particles may exist because of the fact that they may be just physically removed from the substrate surface or they may originate from the plating solution due to poor filtration of the plating solution. In any case once the conductive metal particles attach themselves to a location on the WSID, they may start growing in size because they become cathodic with respect to the electrode. Further, since they are conductive they receive coating and thus grow in size.

ECME methods also use a WSID, and during usage of these methods, the WSID is also in close proximity to, and typically in contact with, the metal surface of the workpiece. During ECME, the potential applied between the workpiece surface and the electrode is reversed rendering the workpiece surface anodic. Therefore, material is removed from the workpiece surface. If WSID is not used during this material removal step, i.e. if there is no mechanical action on the workpiece surface, the process is referred to as just electrochemical etching or polishing. It should be noted that in general both ECMD and ECME processes are referred to as electrochemical mechanical processing (ECMPR) hereinafter, since both involve electrochemical processes and mechanical action.

In addition to conductive particles, there are also non-conductive particles that may accumulate on the WSID material. The non-conductive particles may originate from other parts of the system, such as from the plating solution due to the poor filtration or from the WSID material itself due to the wear and tear during processing.

Presence of such particles on or in close proximity of the surface of the WSID is undesirable because if they become loose and find their way to the interface between the WSID and the workpiece surface, they can cause scratches, inclusions, or other defects on the workpiece surface or they can actually cause scratches on the surface of the WSID, especially if the WSID has a non-flat surface profile.

Therefore, elimination of such particles, or process steps to limit their growth, are very important to increase process yield and the lifetime of the WSID used in planar metal deposition techniques in which particles may come close to or touch the workpiece surface, and particularly when particles are disposed on a WSID that touches the workpiece surface.

SUMMARY

It is an object of the invention to remove or reduce the size of particles that have formed on pads, masks, sweepers or WSIDs used during electrochemical mechanical processing (ECMPR).

It is another object of the invention to limit the rate at which conductive particles form or grow on WSID used during ECMPR.

It is yet another object of the invention to reduce defects on the workpiece.

Certain of the above objects of the invention, among others, either singly or in combination, are achieved in one embodiment by occasionally conditioning the WSID used during ECMPR.

In one embodiment, this involves placing the WSID in the presence of a conditioning substrate and applying a bias that will cause removal of, or reduction in the size of, conductive particles on the WSID.

In another embodiment, the WSID is conditioned using mechanical contact members, such as brushes, and conditioning occurs, for example, through physical brushing of the WSID with the brushes.

In another embodiment, conditioning occurs by rotating the WSIDs used during electrodeposition in different directions, or by rotating successive substrates or workpieces in different directions.

The above and other embodiments can also be combined, as described in further detail below.

BRIEF DESCRIPTION OF THE DRAWINGS

These and other objects, features and advantages of the present invention are better understood by reading the following detailed description of the preferred embodiment, taken in conjunction with the accompanying drawings, in which.

DETAILED DESCRIPTION OF THE PRESENTLY PREFERRED EMBODIMENTS

One way of eliminating the growth of conductive, and typically metallic, or other particles on the workpiece surface influencing device (WSID) surface is to use a "particle elimination step" during electrochemical mechanical processing, either simultaneous with the electrochemical mechanical processing or when intermittently stopping the electrochemical mechanical processing. This step involves using a conditioning system, with a conditioning member that can assist in removing particles. As described hereinafter, this conditioning member can take the form of a conditioning substrate with a plurality of brushes that operates mechanically, a conductive conditioning substrate with conductive brushes that operates both mechanically and electrically, or a conditioning conductor layer that operates electrically. Of course, modifications of these embodiments can also exist. When operating electrically, as described hereinafter, the conductor used to coat is preferably an inert material that cannot be anodized or etched in the plating solution, under a bias, as will be described further hereinafter.

Figure 5:
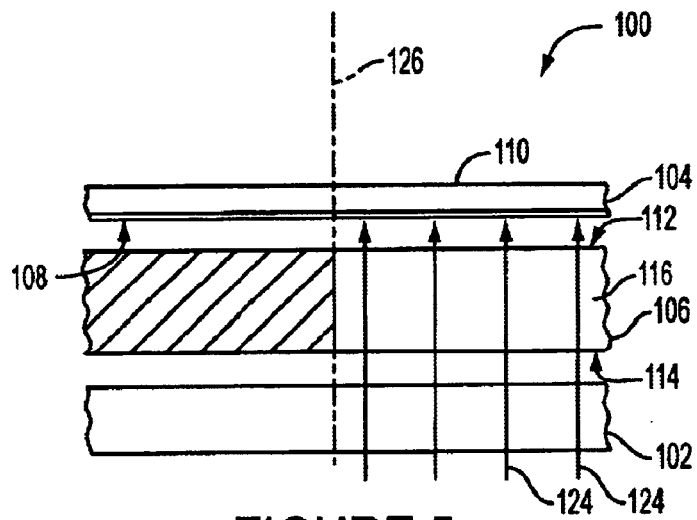
FIG. 5 shows various components of an exemplary electrochemical mechanical processing system.

Reference will now be made to the drawings wherein like numerals refer to like parts throughout. FIG. 5 schematically shows an exemplary electrochemical mechanical processing (ECMPR) system 100 which can be used for ECMD and ECME processes. The system 100 in our example has an electrode 102 and the workpiece 104 and a WSID portion

Figure 1:
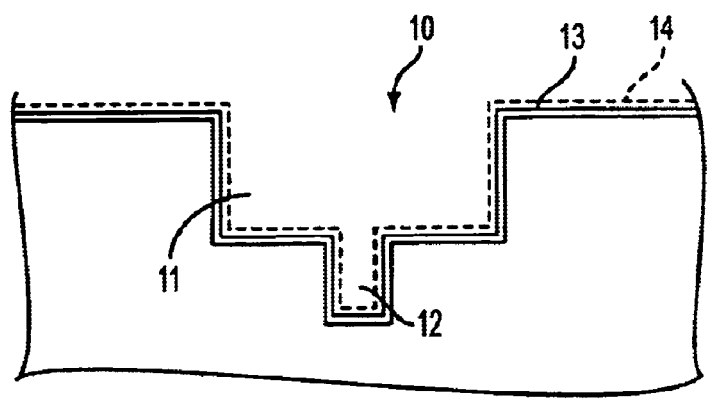
FIGS. 1–4 illustrate various process stages during the plating of a metal on a semiconductor substrate using electrodeposition techniques.
Figure 2:
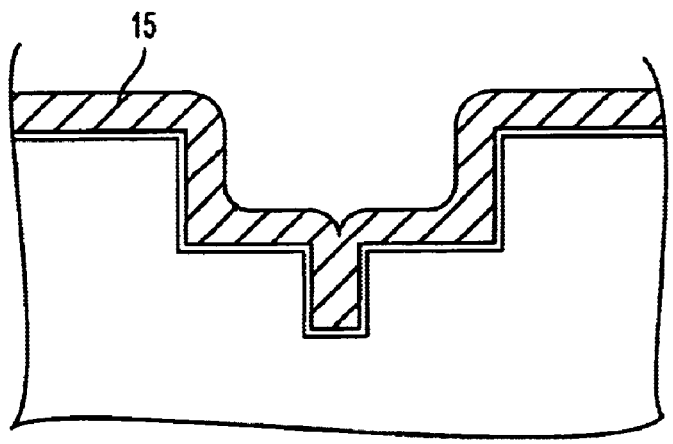
Figure 3:
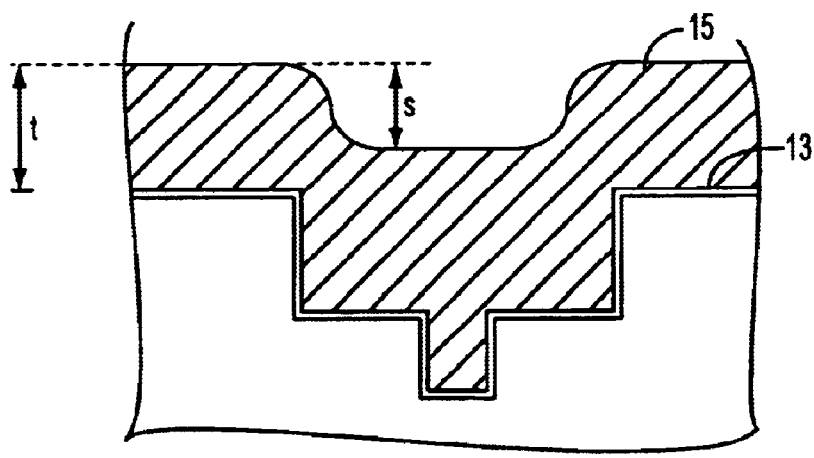
Figure 4:
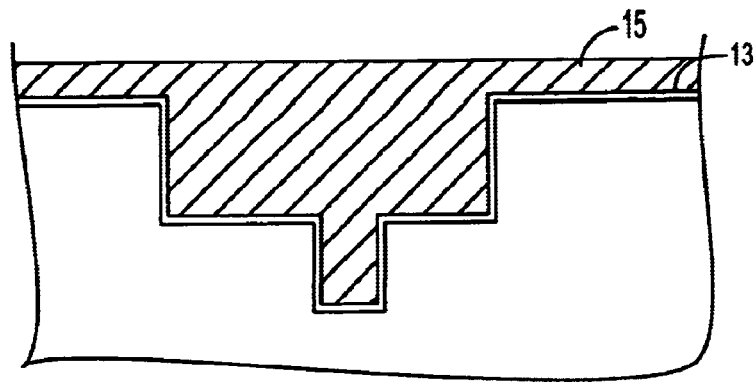

106. When used for ECMD, it will include a plating solution, containing the ionic species of the metal to be deposited, that touches the electrode 102 and the work piece 104. An exemplary copper plating solution may be copper sulfate solution that is commonly used in the industry. The workpiece 104 may be an exemplary substrate, preferably a silicon wafer portion, to be plated with a conductor metal, preferably copper. The substrate 104 comprises a front surface 108 to be plated with copper and a bottom surface 110 to be held by a carrier head (not shown). The front surface 108 may comprise the features shown in FIG. 1.

Figure 6:
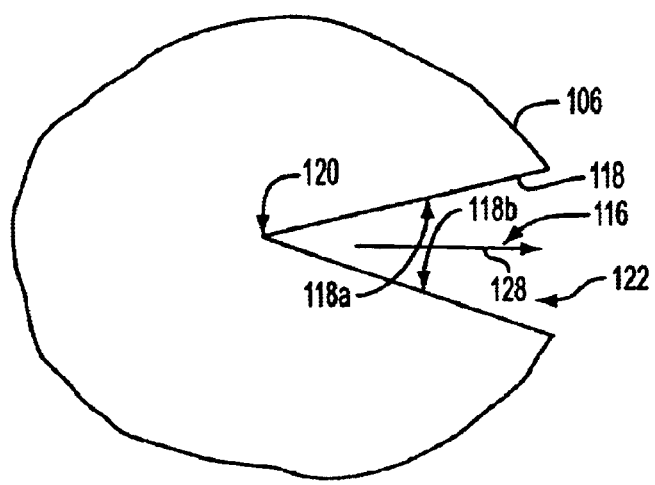
FIG. 6 illustrates an exemplary WSID.

FIG. 6 illustrates in more detail an exemplary WSID portion 106, which may comprise a top surface 112 and a bottom surface 114. The WSID 106 also comprises an exemplary channel 116 extending between the top and the bottom surfaces 112, 114 and defined by sidewall 118 having a first wall 118a and a second wall 118b. The channel also laterally extends between a closed end 120 and an open end 122. Although the channel in this example is V-shaped, it is understood that any shape channel that allows fluid communication between the wafer and the electrode can be used.

During an ECMD process, the front surface 108 of substrate 104 is brought into close proximity, or contact with, the top surface 112 of the WSID 106 for planar metal deposition. As a plating solution, depicted by arrows 124, is delivered to the channel 116, the substrate 104 is rotated about a rotation axis 126 while the front surface 108 contacts the top surface 112 of the WSID 106 or is in close proximity of the top surface 112. For the purpose of clarification, the rotation axis 126 may be the point at which the closed end 120 of the channel 116 is located, thereby ensuring that rotation of the substrate 104 will result in the entire front surface 108 of the substrate 104 having uniform contact with the channel 116. As the solution is delivered and fills the channel 116, it wets the front surface 108 of the substrate 104. Under an applied potential between the substrate and the electrode 102, in the presence of the solution 124 that fills the channel 116, the conductor or metal, such as copper, is plated on the front surface 108 of the substrate and the front surface 108 of the substrate 104 is also swept by the top surface 112 of the WSID 106. This sweeping of the top surface 112 of the WSID 106 assists in obtaining planar deposition of the metal. The solution 124, which is continuously delivered under pressure, will then flow through the channel 116 in the direction of the arrow 128 towards the open end 122 of the channel 116, and exits the WSID 106.

It is noted that the above description described rotation and movement of the substrate 104, assuming that the WSID 106 was stationary. It is understood that the system 100, as described above, will allow for either the substrate or the WSID to move, or for both of them to move, thereby creating the same relative effect. For ease of description, however, the invention was described and will continue to be described in terms of movement of the substrate. Furthermore, the shapes and forms of the channels may be different. When the system 100 is used for ECME, although the same plating solution that is used for the ECMD can still be used, it can be replaced with an electroetching solution or an electropolishing solution or an etching solution. In the ECME case, the WSID will typically contact the workpiece as described above, but the applied potential between the substrate and the electrode 102 will be opposite to that which is used for plating, and will be of the same polarity as that used when conditioning the WSID with a conditioning substrate that uses an applied potential, as discussed hereinafter.

Figure 7A:
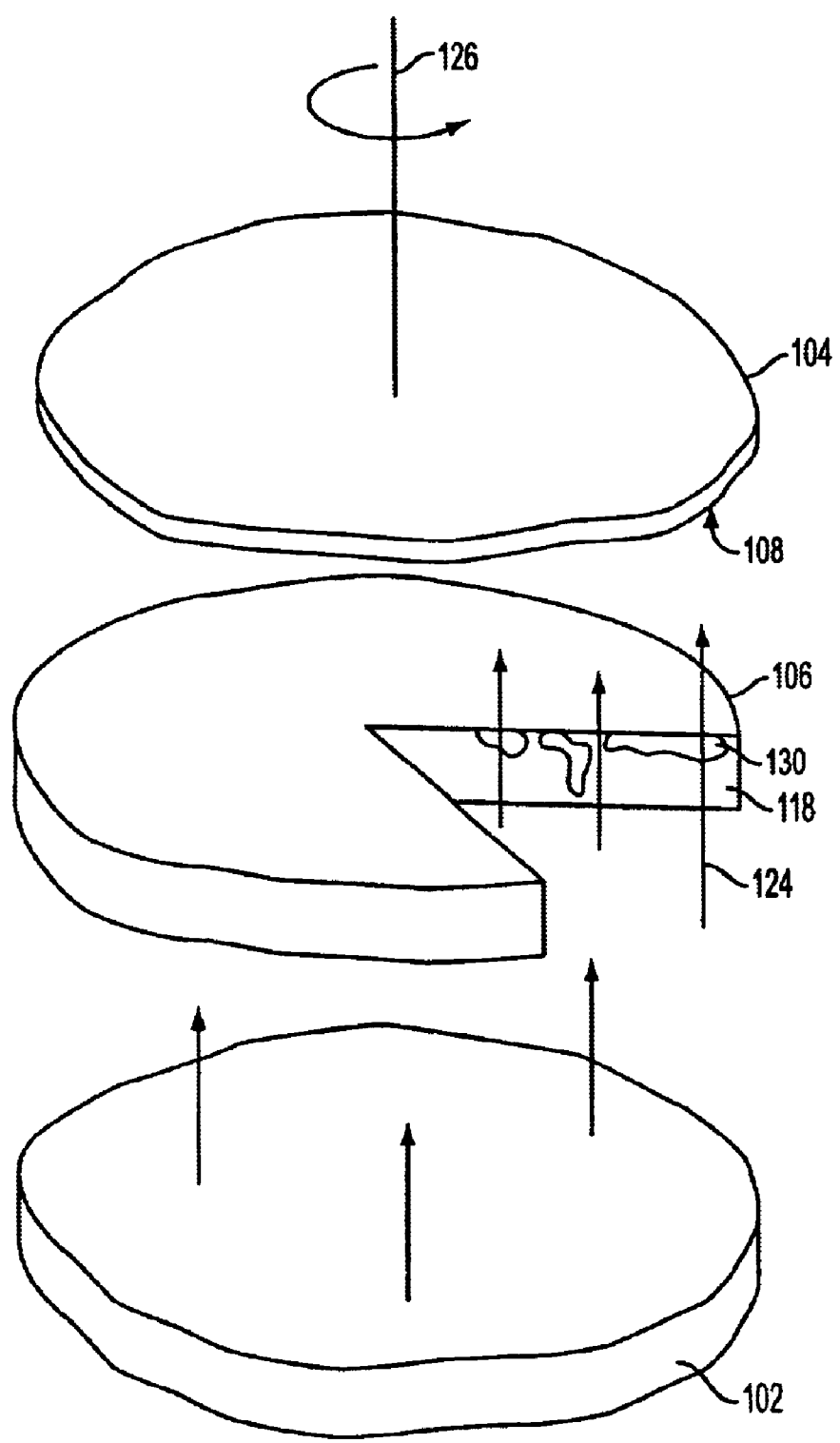
FIG. 7A illustrates the accumulation of particles on an exemplary WSID that can be operated upon according to the present invention.

FIG. 7A exemplifies how the planar plating process through the channel 116 progresses as the substrate 104 is rotated about the rotation axis 126 on the WSID 106 as described above. It should be understood that, for cathodic ECMD, the ionic species in the solution 124 are positively charged. Therefore, during deposition the substrate surface 108 upon which deposition is carried out is rendered cathodic (more negative) with respect to the electrode 102, which becomes the anode. It should be noted that the electrode may be an inert electrode (such as Pt, graphite or Pt-coated Ti etc.) or it may be made of the same metal that is being deposited onto the substrate surface 108 (consumable electrode). When a cathodic voltage is applied to the substrate surface 108 metal deposits out of the plating solution 126 onto the substrate surface 108. However, as mentioned above, as the process progresses, particles 130 may form on the sidewalls 118 of the channel 116. In the process of the present invention, the above ECMD process may be repeated coating metal on certain number of substrate surfaces until the metal particle growth on the WSID becomes a problem. The rate at which particle growth occurs depends upon many factors, in particular how the plating is performed and the applied voltage used during plating in particular. Generally, however, after processing 10–100 wafers or typically after processing 20–50 wafers, undesired particles may start becoming a problem. Similarly, in an ECME process, particles can also attach to the WSID and become a problem. As previously mentioned, presence of such particles on or in close proximity of the surface of the WSID is undesirable because if they become loose and find their way to the WSID/substrate surface interface, they can cause scratches, inclusions, or other defects on the surface or they can actually cause scratches on the surface of the WSID, especially if the WSID has a non-flat profile. For example, when such particles grow beyond 0.5 micron size, it is advantageous to remove them or at least reduce their size using the teachings of the present invention.

It should be understood that ECMD, ECME, and other processes can occur in succession, and that any number of such processes can occur, with a conditioning step occurring thereafter, and then any number of such processes can occur again. For example, an ECMD process, followed by an ECME process, followed by an ECMD process is typical. It may then be desirable to perform conditioning of the WSID according to the present invention, and then resume with some number of processes, for instance another set of ECMD, ECME, and ECMD processes. Alternately, conditioning may be done after the ECMD process before the ECME process, etc.

Figure 7B:
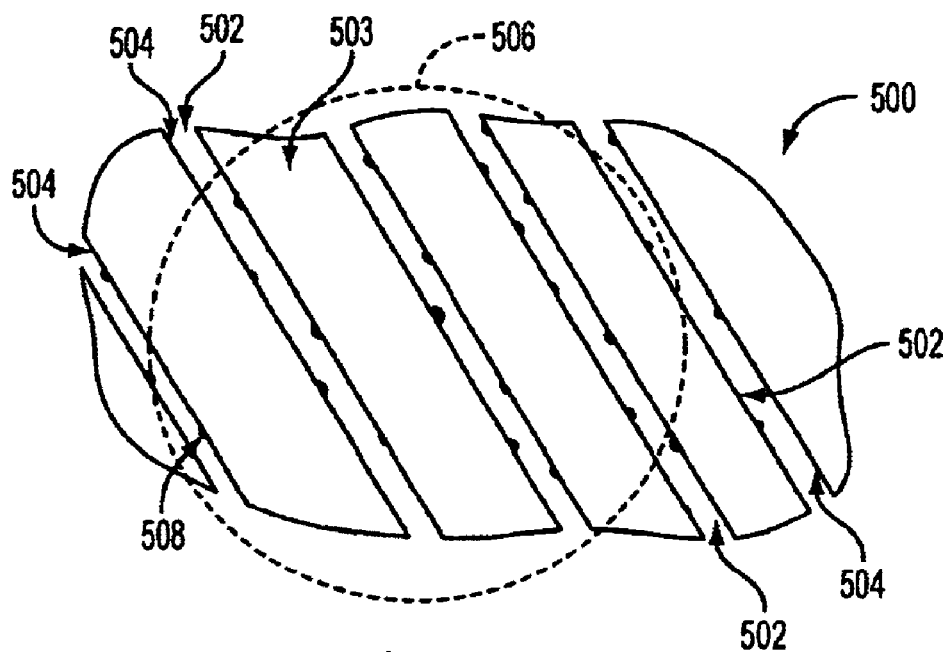
FIG. 7B illustrates the accumulation of particles on another exemplary WSID.
Figure 7C:
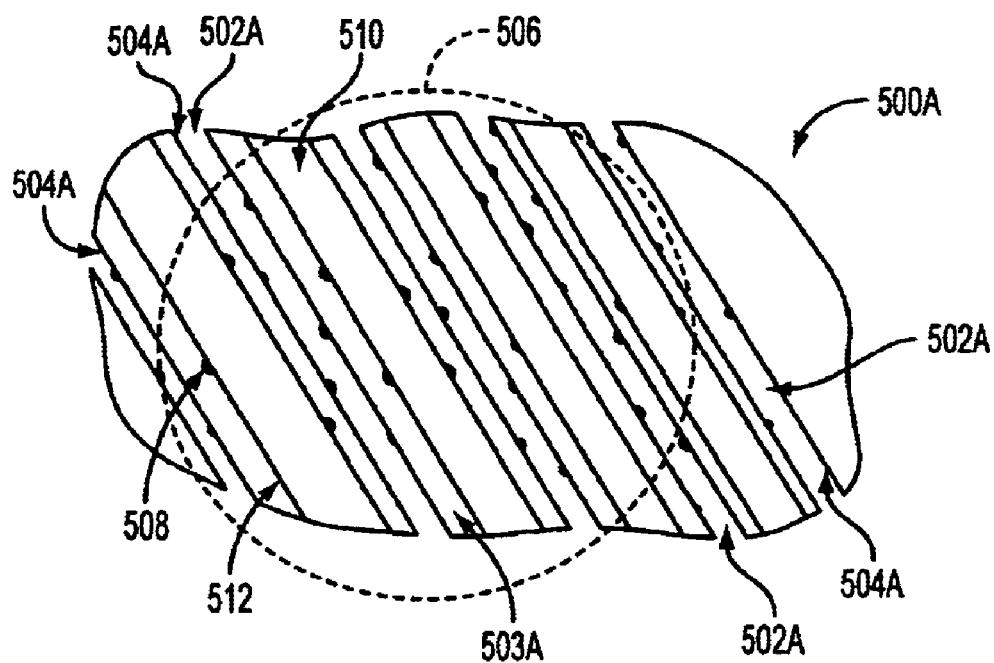
FIG. 7C illustrates the accumulation of particles on yet another exemplary WSID.
Figure 7D:
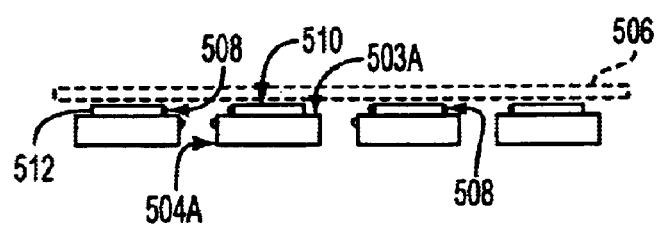
FIG. 7D shows a cross-sectional view of the WSID shown in FIG. 7C.

As mentioned above, channels in a WSID may have different shapes and sizes. FIG. 7B exemplifies a WSID 500 having channels 502 that are shaped as slits, preferably substantially parallel slits, and a top surface 503 or a sweeping surface. Channels 502 may have side walls 504. Channels allow an electrolyte, or another solution to flow between an electrode (not shown) and a front surface of a wafer 506 (shown in dotted lines) which may be rotated and also moved in lateral direction. In this example the top surface 503 of the WSID performs the sweeping action. As the ECMD or ECME process progresses, particles 508 may get attached on the side walls 504. However, as can be seen in FIG. 7C in top view and in FIG. 7D in cross sectional view, a WSID 500A may have a raised surface 510 which is smaller in comparison to the top surface 503A of the WSID 500A. In this embodiment the sweeping function is performed by the raised surface 510. As in the previous case, as the ECMPR progresses, particles 508 may get attached on side walls 512 of the raised surfaces 510. As will be described more fully below, such undesired particles are removed using the teachings of the present invention.

Figure 7E:
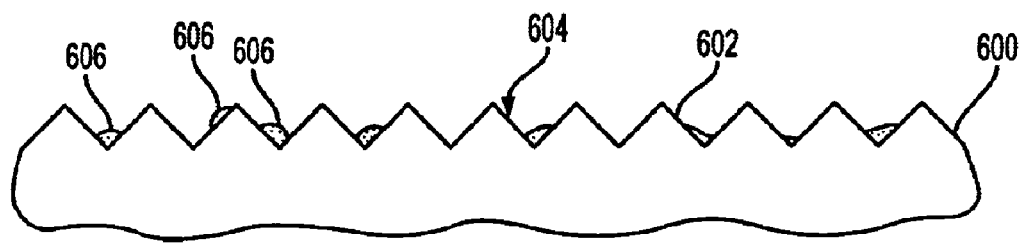
FIG. 7E shows the accumulation of particles on the surface of an exemplary WSID.
Figure 7F:
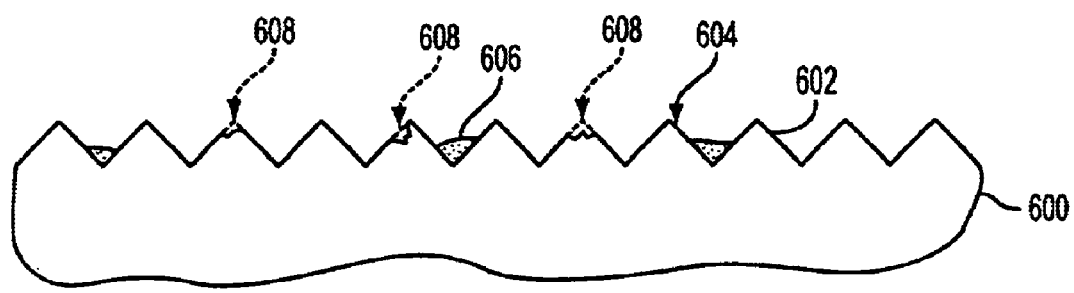
FIG. 7F shows the accumulation of particles on a fatigued surface of an exemplary WSID.

In the above examples, channel and raised surface sidewalls are described as the main particle growth or presence sites. However, such unwanted particle may be on other locations of a WSID for example on the top surface of a WSID. FIG. 7E shows a WSID portion 600. A top surface 602 of the WSID 600 may have various surface features 604 that may enhance mechanical sweeping of a wafer surface (not shown). Features 604 may comprise abrasive particles. As shown in FIG. 7E, particles may get attached or in some cases grow over various locations on the surface features as well, and the particles should be removed using the teachings of the present invention. As shown in FIG. 7F, during the process, portions 608 of the top surface 602 of the WSID may be fatigued and break loose, forming the particles 606, and damage a wafer surface.

Therefore, a cleaning process according to the teachings of the present invention not only cleans such fatigued portions 608 after they are broken off the surface but also removes them safely once they are weakly attached to the top surface before they are broken off.

Figure 8:
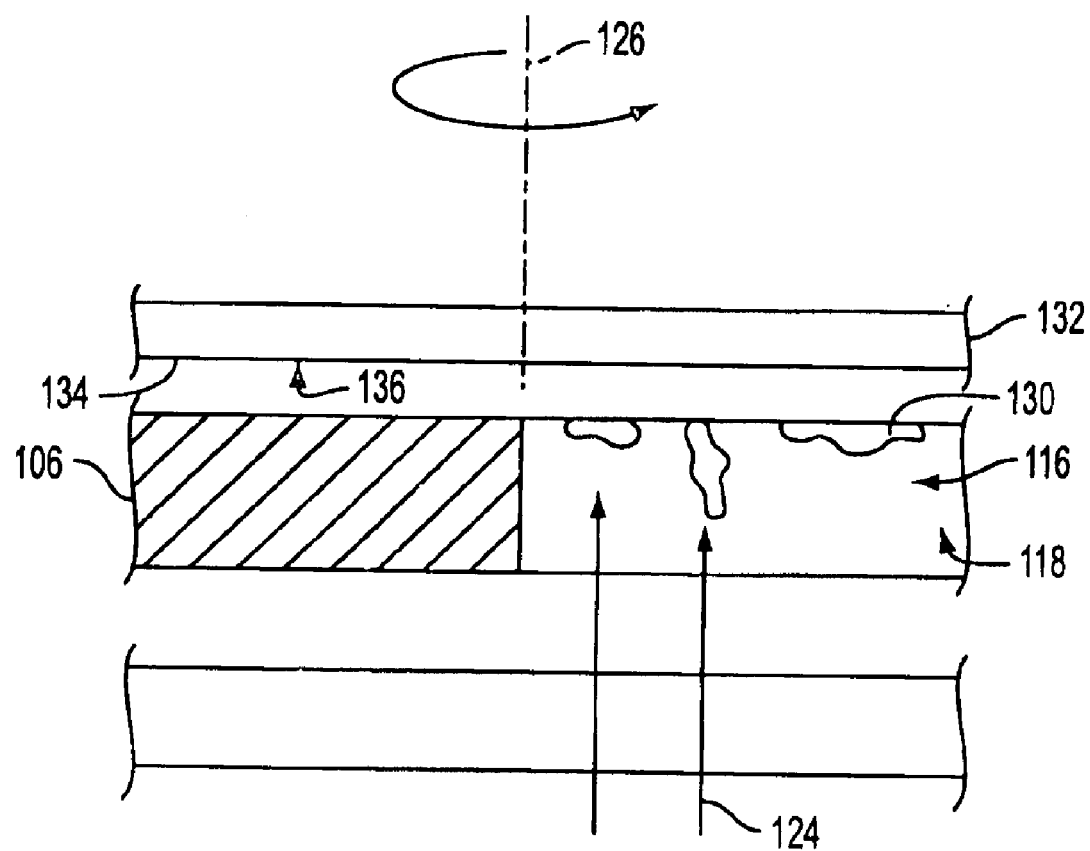
FIG. 8 illustrates usage of an exemplary conditioning substrate according to an embodiment of the present invention.

To that effect, in one embodiment, a conditioning substrate 132, shown in FIG. 8, is coated with a conditioning conductor layer 134 and is substituted in place of the substrate 104. This embodiment of the conditioning substrate 132 may perform the electrochemical cleaning of the WSID 106 to remove conductive particles. As will be described below an alternative embodiment of the conditioning substrate may have mechanical contact members so as to mechanically sweep the WSID 106 (see FIG. 11A) and remove both conductive and non-conductive particles. As will be described below mechanical contact members may mechanically dislodge the particles from the locations where they are accumulated. The surface 136 of the conditioning conductor layer 134 in FIG. 8 is rendered anodic or more positive compared to the electrode 102 and an anodic current density of, for example 0.1–100 mA/cm2 and typically in the range of 1–20 mA/cm2 is applied. This anodic current may be passed for a period of time sufficient to reduce or eliminate such particles. This time period may typically be in the range of 2–10 seconds. The conditioning conductor is a material that does not get, or at least does not substantially get, anodized or etched or otherwise change its character in the plating solution under anodic conditions. It should also not shed any particles. It should, therefore, be preferably made of a hard coating. Inert nitrides of titanium (Ti), tungsten (W) and tantalum (Ta), or platinum (Pt) or Pt-containing alloys, or iridium (Ir) or Ir-containing alloys are good examples of such conditioning conductors for metal deposition processes that deposit common metals or metal alloys containing Cu, Ni, Co or the like. It is noted that this conditioning conductor does not need to have very low resistance like copper. A sheet resistance of 0.1–10 ohms per square is adequate although lower resistances can also be used. In this respect, the conditioning substrate 132 may be a semiconductor wafer coated with the conditioning conductor layer 134. When an anodic voltage is applied to the conditioning conductor layer 134 on the conditioning substrate 132, the metal particles on or near proximity of the WSID 106 also become anodic with respect to the electrode 102. Preferably, during this process, the surface of the conditioning conductor layer makes physical contact to the surface of the WSID. As described above, the conditioning conductor layer 134 on the conditioning substrate 132 does not become substantially affected by the anodic voltage, however, the metal particles 130 become anodized and etched into the plating solution 124. This etching process either causes the particles 130 to completely dissolve into the solution 124 or to become smaller in size, and thereby typically loosen from the sites on which they are located, such as side walls 118 to which they attach themselves, so that the flowing plating solution 124 can wash them out.

Figure 11A:
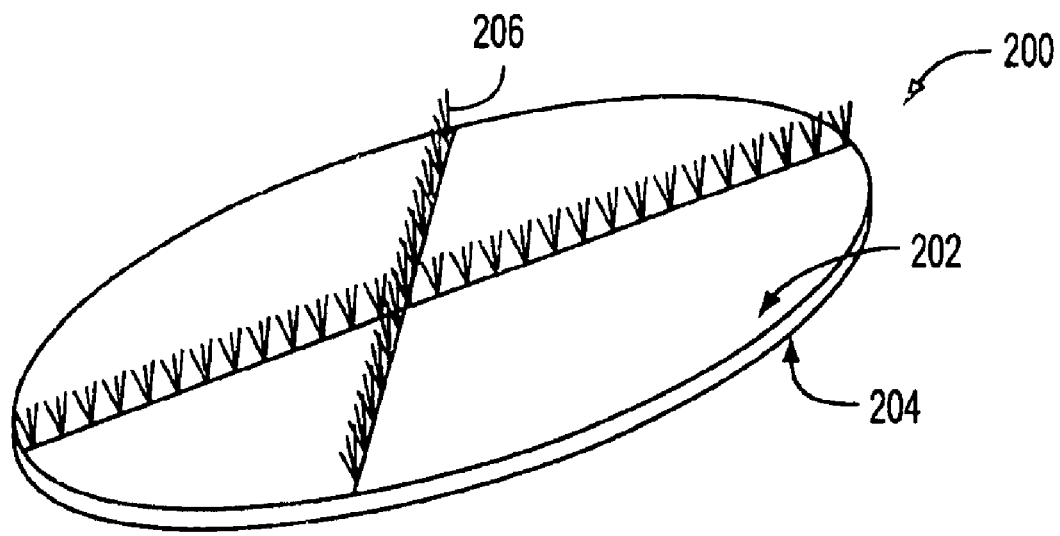
FIG. 11A illustrates an exemplary conditioning member according to another embodiment of the present invention.
Figure 11B:
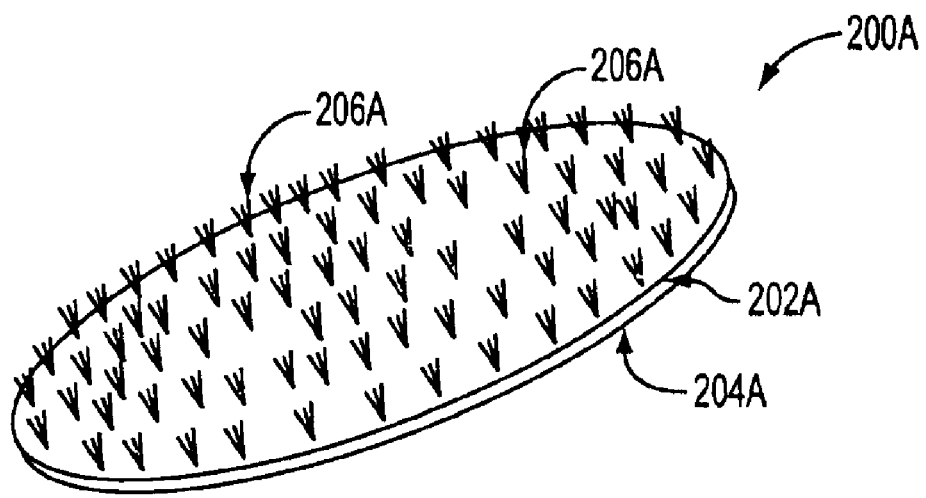
FIG. 11B illustrates another exemplary embodiment of the conditioning member shown in FIG. 11A.

In another embodiment, a conditioning member may be used to mechanically dislodge particles of both natures, conductive or nonconductive. As shown in FIG. 11A, a conditioning member 200 is a plate, preferably disk shaped, having a front surface 202 and a back surface 204. The front surface 202 may have mechanical contact members 206 to mechanically clean the WSID 106. The mechanical contact members 206 may be brushes, wipers or the like. In this embodiment, two lines of brushes 206 are attached on the front surface 202 in a near-perpendicular array so that they cross each other at the center of the front surface 202. As shown in FIG. 11B, in another embodiment, a conditioning member 200A has a front surface 202A and a back surface 204A. In this embodiment, the front surface may comprise a plurality of mechanical contact members 206A that are distributed across the front surface 202A of the conditioning member 200A. Other brush variations can also be used effectively.

Figure 12:
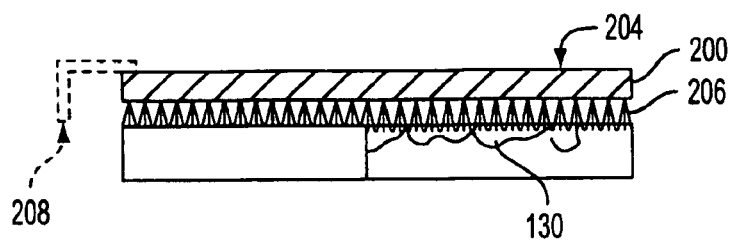
FIG. 12 illustrates usage of the conditioning member of FIG. 11A.

Brushes 206 and the conditioning member 200 may be made of a conductive material or an insulator, depending upon whether conditioning that requires them to conduct is required, as explained herein. When the WSID needs to be cleaned, the conditioning member is placed on the wafer carrier, workpiece holder, or carrier head, and the conditioning member is lowered onto the WSID while being rotated or otherwise moved. As shown in FIG. 12, in operation, the mechanical action between the brushes 206 and the particles 130 dislodges the particles, whether conductive or non conductive, from the sites where they are located, such as side walls 118. The plating solution flow is preferably kept on during this process to wash away any particles that may be dislodged. Although the conditioning member 200 can be used to mechanically clean the WSID, it can also be used for electrochemical cleaning as in the first embodiment above. In this case the conditioning member and the brushes 206 must be made of conductive materials or they must be coated with conductors that would not be anodized in the plating solution. An electrical contact 208 is slidably or otherwise connected to an edge portion of the back surface 204 so that an anodic potential can be applied to the conditioning member. Contact may also be made right at the edge or on the front surface. During the process, application of the potential allows conductive particles, which contact the conductive brushes, to be dissolved selectively electrochemically, while the mechanical action of the brushes removes both the conductive and non-conductive particles mechanically.

In the above embodiments, when a work piece is subsequently processed using the plating solution 124, particles do not present a threat to the integrity of the film because the surface of the WSID is substantially free of particles. If copper is being deposited, for example, without the use of the conditioning process, particles can grow to more than 10 microns in size after running more than 20–50 wafers with WSID touching, with the location of these particles being concentrated along the edges of the channels. Particle size and the growth rate may vary depending on the charge used per substrate and the duration of the process per wafer. In general, a conditioning process may be carried out after processing some number of wafers, such as 10 to 50 wafers, although it is understood that the number of wafers to be processed prior to using the conditioning system requires a balance between the desired throughput and the concentration of undesired particles that can be tolerated.

Figure 9:
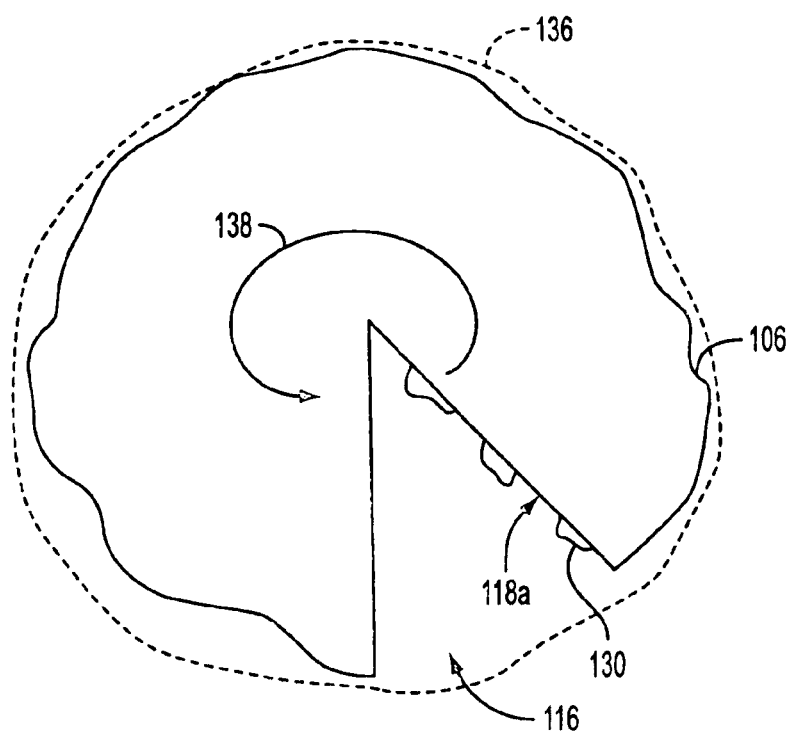
FIGS. 9–10 illustrate another exemplary embodiment of the present invention.
Figure 10:
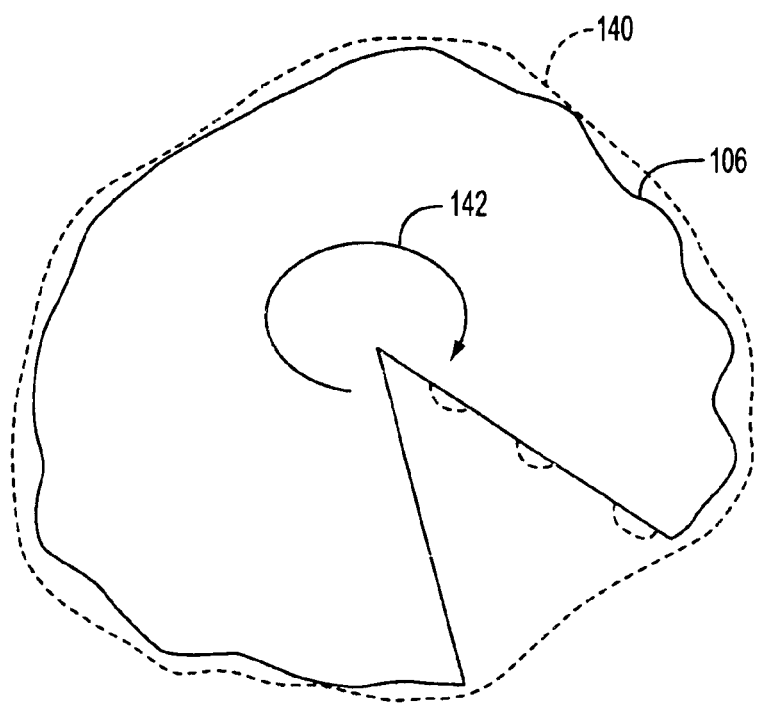

In another embodiment of the present invention, elimination of particle accumulation and growth, or at least a reduction in the formation and/or growth of such particles, along the channels of the WSID 106 is achieved by controlling the rotation direction of a substrate or a wafer in the process from run to run. As shown in FIG. 9, in this embodiment, a first substrate 136 or a wafer is first rotated in a first direction 138 during the processing of the first substrate 136. As shown in FIG. 10, during the processing of a second substrate 140 or a wafer, the substrate 140 is rotated in a second direction 142 that is directly opposite to the first direction 138. This way, the particles 130, conductive or non-conductive, which may start to accumulate along the first sidewall 118*a* of the channel 116 will loosen and be pushed into the channels during the processing cycle of the second substrate 140 without giving them chance to grow and deleteriously affect the quality of the coating on the substrates. This method has particular application to ECMD, although it can also be used with ECME.

The embodiments described above can also be used together to further reduce the presence of undesired particles.

Figure 13:
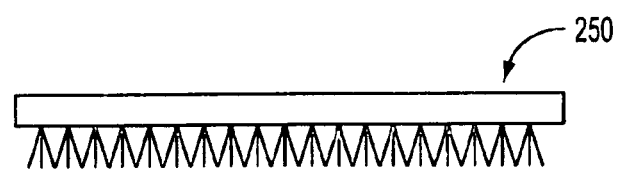
FIGS. 13–15 illustrate an exemplary mechanical contact member and the incorporation of the mechanical contact member into a plating system having a WSID.
Figure 14:
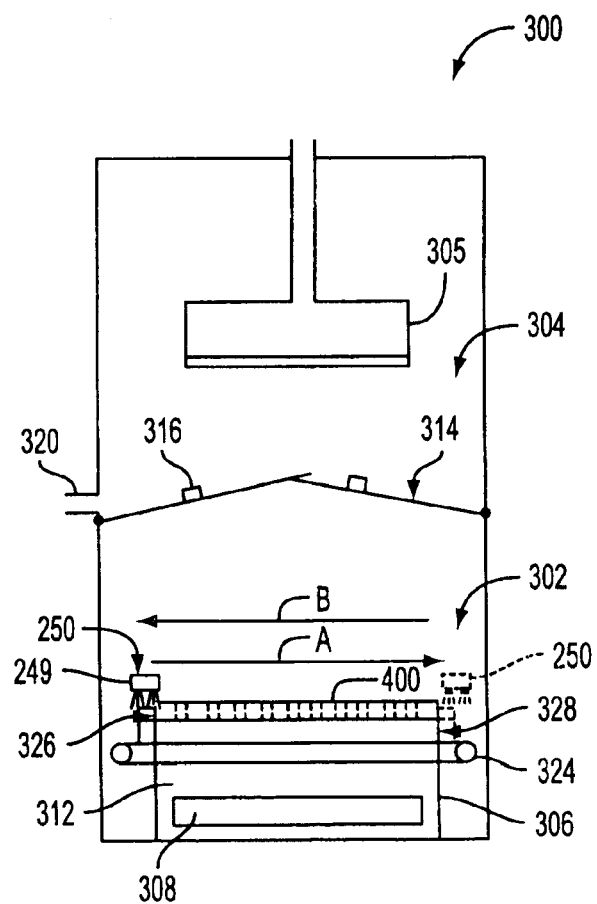
Figure 15:
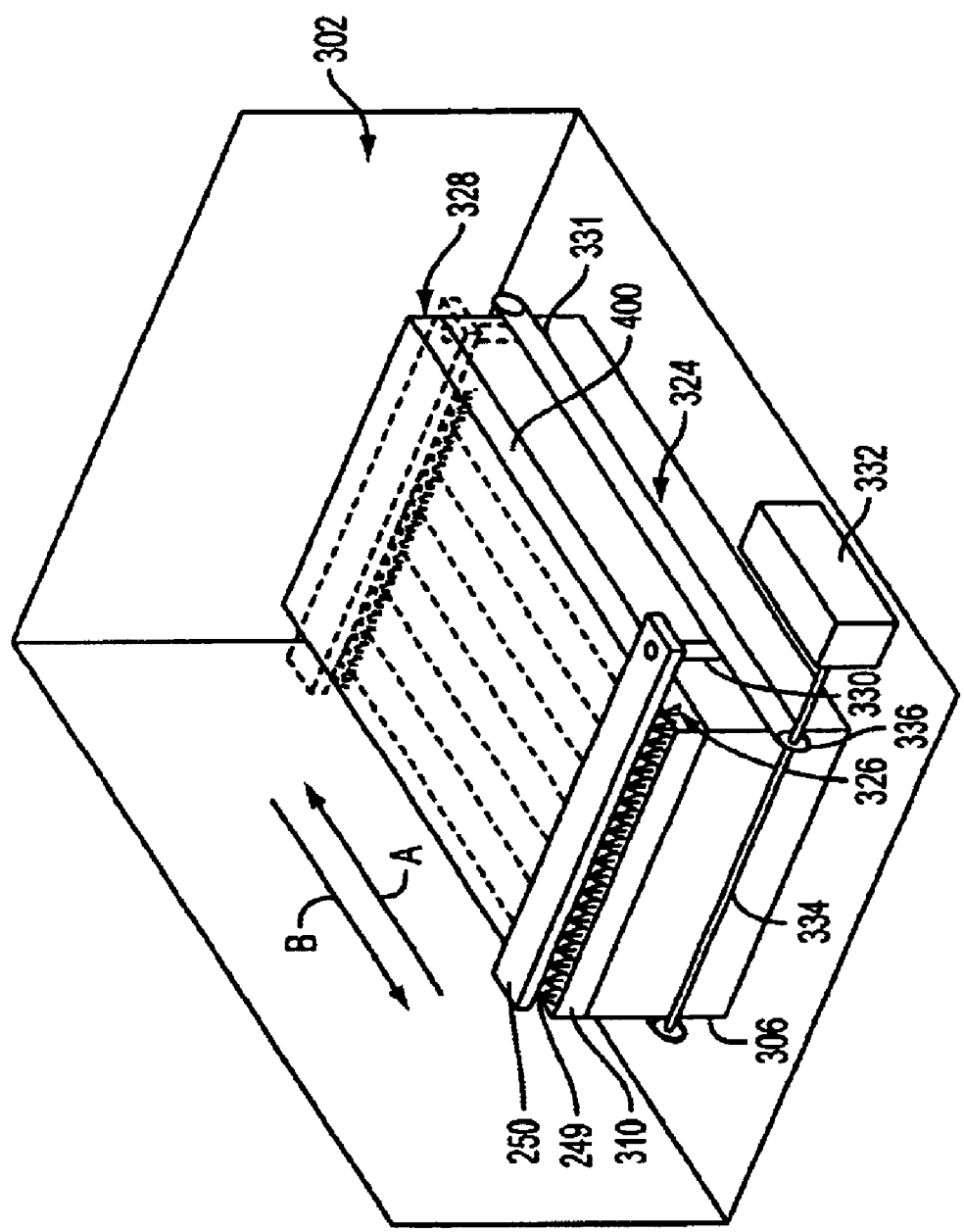

As previously mentioned, the WSID may have different channel configurations and shapes. As shown in FIGS. 13, 14 and 15, in another embodiment, a conditioning device 249 comprising a brush member 250 may be incorporated into an electrochemical mechanical processing (ECMPR) system 300 having a WSID 400.

Figure 16:
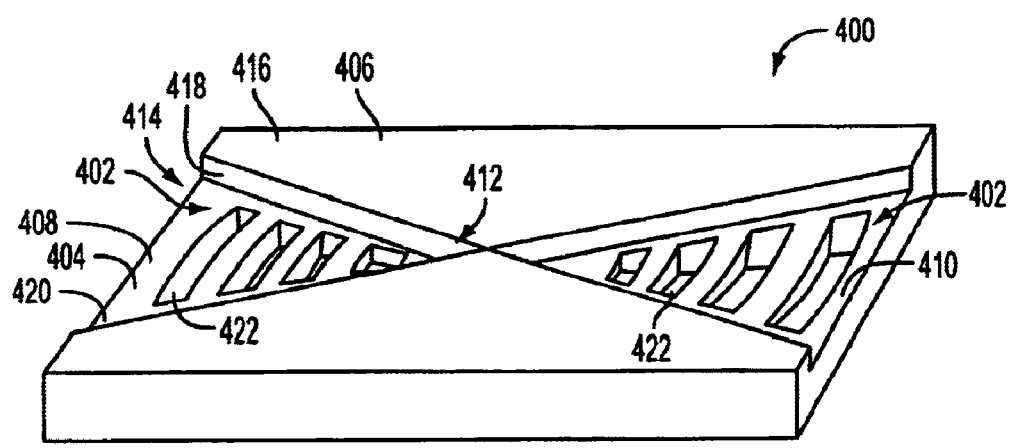
FIGS. 16–18 show an exemplary WSID that can be cleaned or conditioned with the present invention.
Figure 17:
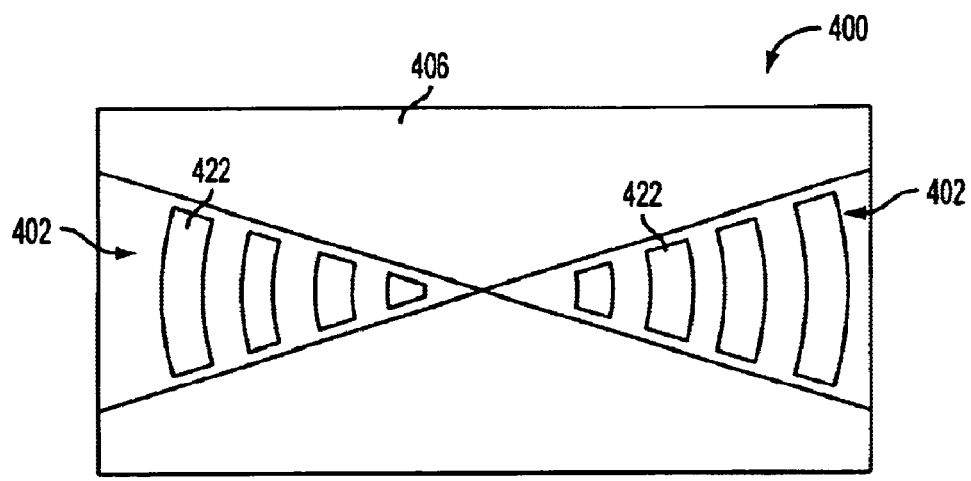
Figure 18:
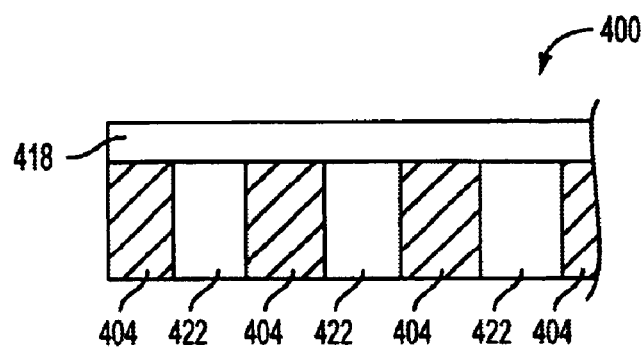

FIGS. 16–18 show an exemplary WSID 400 that can be cleaned or conditioned with the present invention, although any shape WSID, such as the one shown in FIG. 7B or 7C, may be used as suitable. The WSID comprises a channel system 402 comprising recessed channel regions 404 and raised sweeping or polishing regions 406. The channel system 402 may preferably be comprised of more than one channel, such as a first channel 408 and a second channel 410, and more than one polishing region 406. Each channel 408, 410 is comprised of a closed end 412 and an open end 414. Closed ends 412 form a center of the WSID 400. The open ends 414 may also be shaped in other ways without adversely affecting the unique nature of the invention. Preferably, raised polishing regions 406 are comprised of a top surface 416 and a side wall 418. The side wall 418 elevates the top surface from a surface 420 of the recessed region 404. The top surfaces of the raised polishing regions are preferably formed in a coplanar fashion. The top surfaces 416, which may be abrasive, sweeps the wafer surface during the processing, whether that is ECMD or ECME. The top surface may be textured such as shown in FIG. 7E. A number of holes 422 extend between a bottom surface of the WSID 400 and the recessed regions. Holes 422 within the channel regions are formed with a shape so that the inner and outer walls of the holes 422 correspond to the arc at a given radius from the center of the WSID, and are progressively smaller in size as they get closer to the center of the WSID, and are distributed on opposite sides from the center of the WSID in a staggered manner (hole lines up with space as shown) to ensure that the entire wafer will receive a uniform application of electrolyte.

Referring back to FIG. 14, the system 300 comprises a lower chamber 302, an upper chamber 304 and a carrier head 305 holding the wafer. The lower chamber 302 is comprised of a chamber that includes an electro chemical mechanical processing (ECMPR) unit 306. The ECMPR unit 306 comprises an electrode 308 and a WSID 400. As mentioned before, during processing, an electrolyte solution 312 contacts the electrode 308 and flows onto and through the WSID 400. Description of aspects of one such system can be found in U.S. Pat. No. 6,532,632 for "A Vertically Configured Chamber Used For Multiple Processes" which is commonly owned by the assignee of the present invention The conditioning device is also incorporated in the ECMPR unit 306. The upper chamber 304 is separated from the lower chamber 302 by movable guards or flaps 314. In this embodiment, the wafer is loaded in the upper chamber 304 and lowered into the lower chamber 302 for ECMPR. Once the ECMPR is over, the carrier head retaining the wafer is raised into the upper chamber 304 and the flaps 314 are closed. While the wafer is rinsed and dried in the upper chamber 304, the WSID is conditioned in the lower chamber 302 using a brush member 250.

Also referring to FIG. 14, the brush member 250 may be moved on the WSID 400 by a brush assembly 324 which enables the brush member 250 to move between a first end 326 of the WSID and a second end of the WSID 328, in the directions of arrows A and B. The brush assembly is also a part of the conditioning device. The lateral movement of the brush member on the WSID surface mechanically cleans the surface from the conductive and non-conductive particles. The first position is home position of the brush member 250, where the brush member is held when the conditioning process is over. Although the brush member 250 can be used to mechanically clean the WSID, it can also be used for electrochemical cleaning as in one embodiment above. In this case the brush member 250 must be made of conductive materials or it must be coated with conductors that would not be anodized in the plating solution. An electrical contact (not shown) may be connected to the brush member 250 so that an anodic potential can be applied to it. During the process, application of the potential allows conductive particles, which contact the conductive brushes, to be dissolved selectively electrochemically, while the mechanical action of the brushes removes both the conductive and nonconductive particles mechanically.

As shown in FIG. 15, the brush member 250 is mechanically connected by connectors 330 to the belts 331 of the brush assembly 324. A driving motor 332 moves the belts 331 simultaneously along the side of the processing unit 306. The motor 332 moves the belts 331, the connectors 330, and hence the brush member 250 connected to them in the direction of arrows A and B. Belts 324 are connected to the motor 332 through a shaft 334 and wheels 336. As mentioned above, the lower chamber 302 is separated from the upper chamber 304 by movable flaps 314. The upper surface of the flaps 314 comprises cleaning and rinsing fluid nozzles 316. In this embodiment, the cleaning and rinsing is performed in the upper chamber 304 while the cleaning and rinsing solution is delivered to the wafer surface through the nozzles 316. Used solution leaves the system through a drain opening 320. During the process the substrate carrier or carrier head 305 is rotated. Once the ECMPR process is over, the wafer is rinsed and dried in the upper chamber 304 while the WSID is conditioned at the lower chamber 302. During the WSID conditioning, the brush assembly is brought into the operational position and moved across the WSID to sweep the WSID surface. As shown in FIG. 15, upon completion of the process, the brush assembly is moved back into its home position. Although a specific design is disclosed in FIG. 15, it should be understood that many different mechanisms can be used to move the brush members over the WSID to practice the conditioning invention disclosed here.

Figure 19:
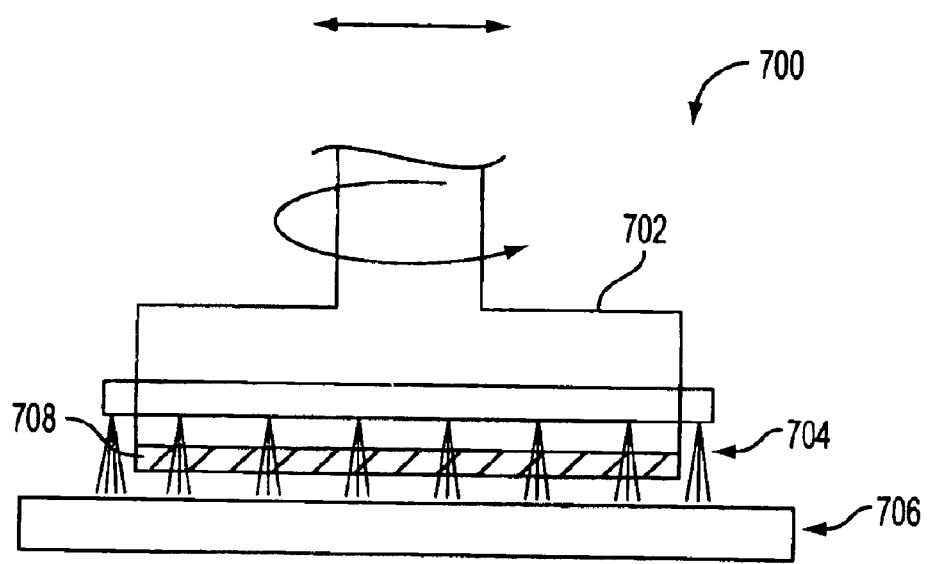
FIGS. 19 and 20 illustrate a conditioning substrate apparatus that can condition a WSID while also performing electrochemical mechanical processing.
Figure 20:
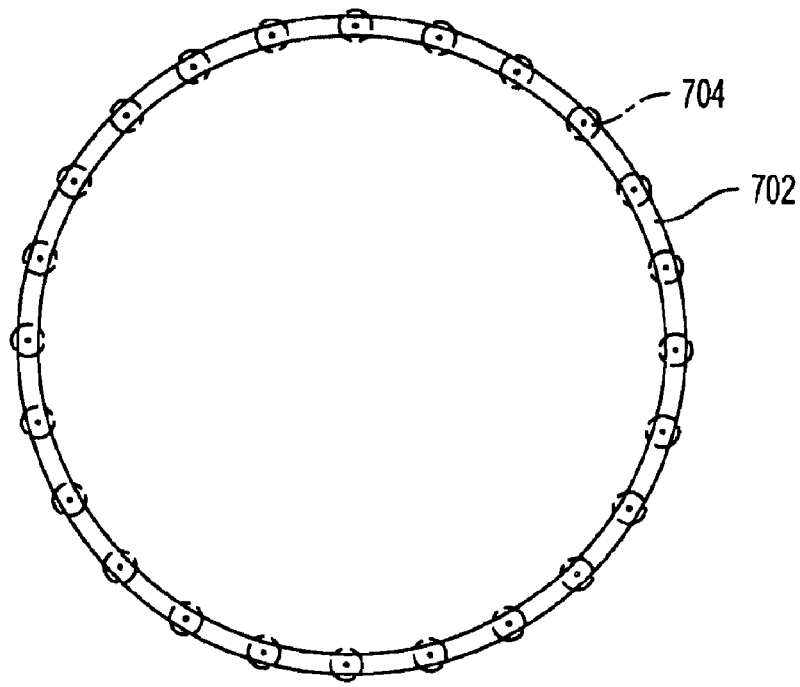

FIGS. 19 and 20 illustrate a side view of yet another conditioning apparatus 700 that includes a carrier head 702 with brushes 704, and a bottom view of the conditioning apparatus 700. As illustrated, the brushes 704 are disposed around the periphery of the carrier head 702. The brushes 704 provide for conditioning of the WSID 706 through mechanical movement, in the same manner as has been discussed previously. In this embodiment, however, ECMPR of the workpiece 708, whether ECMD or ECME, and conditioning of the WSID 706 can occur at the same time, during the same process. In this particular situation, in order to condition the entire WSID 706, the lateral movement the WSID 706 should preferably be equal or greater than the radius of the carrier head 702 so that the WSID portion it covers can effectively be cleaned.

While the present invention has been described herein with reference to particular embodiments thereof, a latitude of modification, various changes and substitutions are intended in the foregoing disclosure. It will thus be appreciated that in some instances some features of the invention will be employed without a corresponding use of other features without departing from the spirit and scope of the invention.

What is claimed is:

1. A method of processing that includes conditioning a workpiece surface influencing device, the workpiece surface influencing device being used during at least a portion of at least one electrochemical mechanical process that operates upon a workpiece using a solution, the method comprising:

operating upon the workpiece using the solution in the electrochemical mechanical process, with the workpiece surface influencing device being disposed in proximity to the workpiece for a period of time during the electrochemical mechanical process, the electrochemical mechanical process also resulting in accumulation of conductive particles onto the workpiece surface influencing device; and conditioning the workpiece surface influencing device before performing another electrochemical mechanical process, the step of conditioning including applying a potential difference between an electrode and a conditioning member, the application of the potential difference during the step of the conditioning resulting in one of the number of accumulated conductive particles being reduced and the size of the accumulated conductive particles being reduced.

2. The method according to claim 1 further including the step of performing the another electrochemical mechanical process.

3. The method according to claim 2 wherein the electrochemical mechanical process is a first electrochemical mechanical deposition process and the another electrochemical mechanical process is a second electrochemical mechanical deposition process.

4. The method according to claim 3 wherein the first electrochemical mechanical deposition process operates upon the workpiece and the second electrochemical mechanical deposition process operates upon another workpiece that is different from the workpiece.

5. The method according to claim 3 wherein the first electrochemical mechanical deposition process operates upon the workpiece and the second electrochemical mechanical deposition process operates upon the workpiece.

6. The method according to claim 2 wherein the electrochemical mechanical process is an electrochemical mechanical deposition process and the another electrochemical mechanical process is an electrochemical mechanical etching process.

7. The method according to claim 6 wherein the electrochemical mechanical deposition process operates upon the workpiece and the electrochemical mechanical etching process operates upon the workpiece.

8. The method according to claim 1 wherein the electrochemical mechanical process is an electrochemical mechanical deposition process and the conductive particles that are reduced in the step of conditioning are formed and accumulated during the electrochemical mechanical deposition process.

9. The method according to claim 1 wherein the electrochemical mechanical process is an electrochemical mechanical etching process and the conductive particles that are reduced in the step of conditioning are formed and accumulated during the electrochemical mechanical etching process.

10. The method according to claim 1, wherein the electrochemical mechanical process also results in accumulation of non-conductive particles onto the workpiece surface influencing device.

11. The method according to claim 10 wherein the non-conductive particles are reduced in the step of conditioning.

12. The method according to claim 11 wherein the step of conditioning further includes:

establishing frictional mechanical contact between the workpiece surface influencing device and the conditioning member.

13. The method according to claim 12, wherein the step of conditioning rotates the conditioning member against the workpiece surface influencing device.

14. The method according to claim 12, wherein the step of conditioning moves the conditioning member in a lateral direction against the workpiece surface influencing device.

15. The method according to claim 2 wherein the electrochemical mechanical process is a plurality of electrochemical mechanical processes and the another electrochemical mechanical process is another plurality of electrochemical mechanical processes.

16. The method according to claim 15 wherein the plurality of electrochemical mechanical processes includes an electrochemical mechanical deposition process and an electrochemical mechanical etching process.

17. The method according to claim 16 wherein the another plurality of electrochemical mechanical processes includes another electrochemical mechanical deposition process and another electrochemical mechanical etching process.

18. The method according to claim 15 wherein the plurality of electrochemical mechanical processes includes a first electrochemical mechanical deposition process and an electrochemical mechanical etching process and a second electrochemical mechanical deposition process.

19. The method according to claim 18 wherein the another plurality of electrochemical mechanical processes includes another first electrochemical mechanical deposition process and another electrochemical mechanical etching process and another second electrochemical mechanical deposition process.

20. The method according to claim 1 wherein during the step of operating upon the workpiece using the solution in the electrochemical mechanical process, the workpiece surface influencing device contacts the workpiece during the period of time.

21. The method according to claim 1 wherein during the step of operating upon the workpiece using the solution in the electrochemical mechanical process, the workpiece surface influencing device does not contact the workpiece during the period of time.

22. The method according to claim 1 wherein during the step of operating, the solution flows through channels formed in the workpiece surface influencing device, and during the step of conditioning, the conductive particles formed within the channels are reduced.

23. The method according to claim 22 wherein during the step of operating, the solution flows through channels formed in the workpiece surface influencing device, and during the step of conditioning, the conductive particles associated with the electrochemical mechanical processing that are formed within the channels are reduced.

24. The method according to claim 8 wherein during the step of operating, the solution flows through channels formed in the workpiece surface influencing device, and during the step of conditioning, the conductive particles associated with electrochemical mechanical deposition that are formed within the channels are reduced.

25. The method according to claim 1 further including the steps of removing the workpiece from being disposed in proximity to the workpiece surface influencing device upon completion of the operating step; and wherein the step of conditioning includes the step of bringing the conditioning member in proximity to the workpiece surface influencing device so that the step of conditioning can then occur.

26. The method according to claim 25 wherein the steps of removing and bringing both use a holder, and the holder holds the workpiece during the step of operating and the holder holds the conditioning member during the step of conditioning.

27. The method according to claim 1 wherein the step of conditioning further includes:
establishing frictional mechanical contact between the workpiece surface influencing device and the conditioning member.

28. The method according to claim 27 wherein the step of establishing frictional mechanical contact established that contact using brushes that are part of the conditioning member.

29. The method according to claim 27, wherein the step of conditioning rotates the conditioning member against the workpiece surface influencing device.

30. The method according to claim 27, wherein the step of conditioning moves the conditioning member in a lateral direction against the workpiece surface influencing device.

31. The method according to claim 26 wherein the step of conditioning further includes:
establishing frictional mechanical contact between the workpiece surface influencing device and the conditioning member.

32. The method according to claim 31, wherein the step of conditioning rotates the conditioning member against the workpiece surface influencing device.

33. The method according to claim 31, wherein the step of conditioning moves the conditioning member in a lateral direction against the workpiece surface influencing device.

34. A method of processing a workpiece and removing particles on a workpiece surface influencing device, the workpiece surface influencing device being used in conjunction with a plating solution to process the workpiece, comprising:
applying a first potential difference between an electrode and the workpiece;
depositing, via the plating solution, conductive material onto the workpiece in the presence of the first potential difference with a top surface of the workpiece surface influencing device in close proximity to the workpiece; and
moving a conditioning member having at least one mechanical contact member against the top surface of the workpiece surface influencing device so that at least a portion of the particles that accumulate on the workpiece surface influencing device during the depositing of the conductive material are mechanically removed from the workpiece surface influencing device.

35. The method according to claim 32, wherein the at least one mechanical contact member comprises a plurality of conductive brushes and further including the step of applying a second potential difference to the plurality of conductive brushes that will assist in removing the particles from the workpiece surface influencing device.

36. The method according to claim 35, wherein the step of moving causes relative rotational motion between the at least one mechanical contact member and the workpiece surface influencing device.

37. The method according to claim 36, wherein the step of moving causes relative lateral motion between the at least one mechanical contact member and the workpiece surface influencing device.

38. The method according to claim 32, wherein the step of moving causes relative motion between the at least one mechanical contact member comprising a plurality of brushes and the workpiece surface influencing device.

39. The method according to claim 32, wherein the workpiece surface influencing device includes a plurality of channels through which the plating solution passes, and during the step of moving the plating solution continues to pass through the plurality of channels, and during the step of moving applying a second potential difference between the electrode and the at least one mechanical contact member of the conditioning member, the second potential difference being of an opposite polarity to the first potential difference that will assist in removing the conductive particles from the workpiece surface influencing device.

40. The method according to claim 34 further including the steps of
removing the workpiece from being disposed in proximity to the workpiece surface influencing device upon completion of the operating step; and
bringing a conditioning member in proximity to the workpiece surface influencing device so that the step of conditioning can then occur.

41. The method according to claim 40 wherein the steps of removing and bringing both use a holder, and the holder holds the workpiece during the step of depositing and the holder holds the conditioning member during the step of moving.

42. A method of processing including reducing accumulation of particles on a workpiece surface influencing device, the workpiece surface influencing device being used in conjunction with a plating solution to operate upon a first and second workpiece, comprising:
depositing, with the workpiece surface influencing device in close proximity to the first workpiece, first conductive material onto the first workpiece using the plating solution, and during depositing causing relative rotational motion in a first rotational direction between the workpiece surface influencing device and the first workpiece;
replacing the first workpiece with the second workpiece;
depositing, with the workpiece surface influencing device in close proximity to the second workpiece, second conductive material onto the second workpiece, and during depositing causing relative rotational motion in a second rotational direction opposite the first rotational direction between the workpiece surface influencing device and the second workpiece so that at least a portion of the particles that accumulate on the workpiece surface influencing device during the depositing of the first conductive material are removed from the workpiece surface influencing device.

43. The method according to claim 42 wherein the steps of causing relative rotation rotates one of the workpiece surface influencing device and the first or second workpiece.

44. The method according to claim 42 wherein the steps of causing relative rotation rotates both the workpiece surface influencing device and the first or second workpiece.

* * * * *